United States Patent [19]

McDermott et al.

[11] Patent Number: 5,043,845
[45] Date of Patent: Aug. 27, 1991

[54] HIGH-SPEED CCD SENSOR MOUNTING SYSTEM WITH IMPROVED SIGNAL TO NOISE OPERATION AND THERMAL CONTACT

[75] Inventors: Bruce C. McDermott, Penfield; Leslie G. Moore, Jr., Webster; John D. Meierdiercks, Rochester; James R. Milch, Pittsford, all of N.Y.

[73] Assignee: Eastman Kodak Company, Rochester, N.Y.

[21] Appl. No.: 422,183

[22] Filed: Oct. 16, 1989

[51] Int. Cl.⁵ .............................................. H05K 7/20
[52] U.S. Cl. .................................. 361/387; 174/16.3; 357/30; 357/81; 361/384
[58] Field of Search .................... 363/141; 357/24 LR, 357/30, 81; 174/16.3, 252, 260; 165/80.3, 185; 361/383, 384, 386, 387, 388, 400, 403, 405, 410, 414

[56] References Cited

U.S. PATENT DOCUMENTS

| | | | |
|---|---|---|---|
| 4,148,052 | 4/1979 | Nathanson | 357/55 |
| 4,451,842 | 5/1984 | Pommerrenig | 357/30 Q |
| 4,509,096 | 4/1985 | Baldwin | 361/387 |
| 4,546,410 | 10/1985 | Kaufman | 361/387 |
| 4,777,560 | 10/1988 | Herrell | 361/384 |
| 4,853,828 | 8/1989 | Penn | 174/16.3 |
| 4,914,551 | 4/1990 | Anschel | 361/386 |
| 4,924,352 | 5/1990 | Septfons | 357/81 |

Primary Examiner—Gerald P. Tolin
Attorney, Agent, or Firm—Edward Dugas

[57] ABSTRACT

The present image sensor mounting system is particularly adapted to the mounting of a linear sensor array, of the type having a transparent window on a front surface and a thermal and electrically conductive back surface. The system provides superior electrical and thermal transfer characteristics. A heat sink having at least one flat surface is positioned to make thermal contact with the back surface of the image sensor. A multilayer circuit board having layers of conductive material separated by layers of insulating material and having an opening therethrough sufficient in size to accept the heat sink provides the system support. A metal plating extends from one surface of the board through the opening in the board to the opposite surface of the board with selected ones of the layers of conductive material making electrical contact with the metal plating. The heat sink is mounted in the multilayer circuit board opening in thermal and electrical contact with the metal plating. A layer of thermal and electrically conductive grease is layered between the at least one surface of the heat sink and the conductive back surface of the linear sensor array.

13 Claims, 5 Drawing Sheets

HIGH-SPEED CCD SENSOR MOUNTING SYSTEM WITH IMPROVED SIGNAL TO NOISE OPERATION AND THERMAL CONTACT

TECHNICAL FIELD OF THE INVENTION

The present invention is related to a semiconductor mounting system and, more particularly, to the mounting of CCD image sensors with improved thermal and signal to noise operation.

BACKGROUND OF THE INVENTION

As the frequency of operation of CCD sensors increases, and the system signal to noise requirements increase, it becomes increasingly important to provide good electrical contact to the CCD imager substrate. In addition, CCD sensors have relatively high capacitance loading on their high speed clocks. This compounds the problem, as the CCD is clocked at higher rates, more power is dissipated (creating heat) and this increases the need for good heat dissipation. (Dark current, a thermally generated noise source, doubles with every 10 degree Celsius substrate temperature increase.) CCD imagers have a transparent window on their front surface, therefore any heat sink attachment must be done on the rear surface. Linear CCD imagers compound the noise problem by virtue of their increased length. The increased length increases the length of the current return paths to the CCD support electronics.

The mounting of the linear type CCD array therefore should be such that minimal noise is generated and heat dissipation is efficient.

CCD sensors work by applying various clock and bias voltages to the device, the bias voltages being measured against a reference potential on the sensors. The reference plane on the sensor can be either the substrate of the device itself or a well potential if the imager is built within a P or N type well. Clock drivers are designed to supply high edge currents in order to provide the changes in voltage required by the sensor. Typical voltage drive waveforms are square waves. When driving a capacitive load the primary current flows on the transitions from one voltage level to another. The current must flow out of the driver through the capacitive load to the sensor's reference plane. All non-cancelled currents are returned to the drivers thereby closing the loop. Resistance or inductance in this current path results in a voltage drop being generated and will cause the reference plane of the sensor to "bounce" on clock edge transitions generating noise in the imager output. Reducing the parasitic inductance and resistance of the current return path is critical to the reduction of clock feed-through generated noise.

SUMMARY OF THE INVENTION

Therefore, it is a primary object of the present invention to provide a system with good electrical and thermal connection between the back side contact of a linear CCD imager package and the system reference potential, thereby reducing parasitic inductance and resistance in the current return path.

In one preferred embodiment of an image sensor mounting system, there is provided an image sensor having a transparent window on a front surface and a thermal and electrically conductive back surface. A heat sink formed with at least one surface for making thermal contact with the back surface of said image sensor is also provided. A multilayer circuit board, having layers of conductive material separated by layers of insulating material and having an opening therethrough sufficient in size to accept the heat sink has a metal plating extending from one surface of said board through the opening in said board to the opposite surface of said board. Selected ones of the layers of conductive material make electrical contact with the metal plating. The heat sink is mounted in said multilayer circuit board opening in thermal and electrical contact with the metal plating. A layer of thermal and electrically conductive grease is positioned on at least one surface of said heat sink and the image sensor is mounted on the heat sink sandwiching the layer of grease.

From the foregoing, it can be seen that it is a primary object of the present invention to provide a mounting system for an image sensor which facilitates removal of the sensor from the multilayer circuit board.

It is another object of the present invention to provide an image sensor mounting system which compensates for temperature expansion and contraction of the system components with minimum distortion of the image sensor.

The above and other objects of the present invention will become more apparent when taken in conjunction with the following description and drawings wherein like characters indicate like parts and which drawings form a part of the present invention.

DESCRIPTION OF THE PREFERRED EMBODIMENTS

Figure 1:
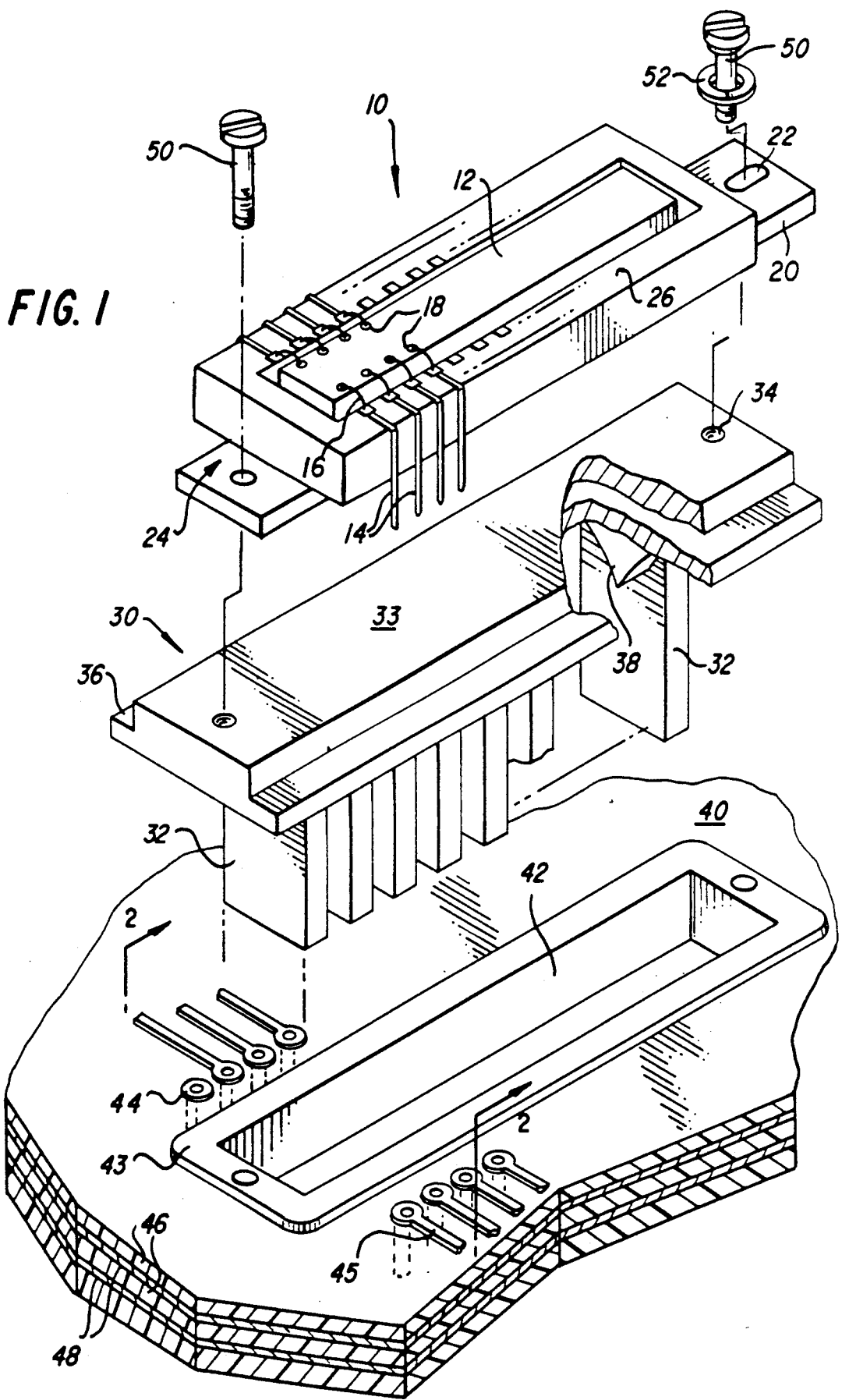
FIG. 1 is an exploded perspective view of the preferred embodiment of the present invention for mounting a linear sensor.

Referring to FIG. 1, a semiconductor device such as a linear sensor array 10 is shown comprised of a frame member 26, with a cavity in its center. At the back, or bottom surface of this frame member 26, is an electrically and thermally conductive bar 24 that extends past the full length of the frame member 26. This bar 24 has a thermal coefficient of expansion matched to the thermal coefficient of expansion of the sensor array 10. The sensor array 10 is mounted inside the cavity of the frame 26 on the top surface of the bar 24. Electrical pads 18 on the chip 12 are connected to pin conductors 14 by means of wire jumpers 16. The bar 24 has openings 22 defined therethrough for receiving a mounting fastener such as a screw 50. At least one of the openings 22 should be elongated to allow for expansion or contraction. A heat sink member 30 is provided with a flat surface 33 for abutting against the bar member 24. At each end of the heat sink 30, is a tapped hole 34 which is aligned with the hole 22 to receive the screws 50. Relatively thin flanges 36 are provided along parallel outside edges of the heat sink 30 to increase thermal and electrical contact and to facilitate the removal of the semiconductor element 10 by providing a recessed area under the frame member 26 within which a removing tool may be inserted and also to provide a bonding (soldering) surface. Extending from the back end or bottom surface of the heat sink 30, which surface is opposite the flat surface 33, are a plurality of fins 32 along with a substantially V-shaped deflector member 38 which is interposed between each of the fins 32. The deflector member is used in conjunction with a fan (shown in FIG. 6) to direct air flow outwards from between the fins 32 in a streamlined manner.

A multilayered printed circuit board 40 having an opening 42 therethrough is adapted to receive the heat sink fins. The multilayered board is comprised of a plurality of insulating layers 46 and a plurality of conductive layers 48 hereinafter referred to as reference layers. Extending through the PC board are a plurality of plated through holes 44 adapted to receive the conductive pins 14 of the linear sensor array 10. The plated through holes 44 are electrically connected to trace conductors 45 on any layer of the printed circuit board 40. The opening 42 is plated through with conductive metal to form a flange 43 preferably on both exterior surfaces of the board 40. The plating is also electrically connected to the plurality of conductive layers 48. In assembly the heat sink 30 is soldered to the top flange 43 of the plated through hole 42, thereby providing electrical contact and additionally, a thermally radiator type dissipation path due to the electrical and thermal connection to the conductive layers 48 throughout the printed circuit board 40 and the heat sink 30. In the preferred embodiment, the plated through metal used is copper but other metals may be used with different degrees of acceptability.

As previously stated, the screw-type fasteners 50 extend through the openings 22 in the flanges of the semiconductor device 10 and engage the tapped holes 34 in the heat sink 30. At one end of the linear sensor array 10 a Belleville washer 52 is inserted between the head of the shoulder screw 50 and the flange 20 to provide for a limited degree of motion of the linear sensor array to compensate for different degrees of thermal expansion between various components forming the mounting system so as to maintain the flatness of the CCD array 12. Additionally, to increase the thermal and electrical conductivity between the bar member 24 of the linear sensor array 10 and the flat surface 33 of the heat sink 30, a thermally and electrically conductive grease such as Chromerics P/N 4220, 77 Daason Court, Woburn, MA 01888, is layered onto the surface 33 prior to assembly of the linear sensor array 10 onto the heat sink 30.

Figure 2:
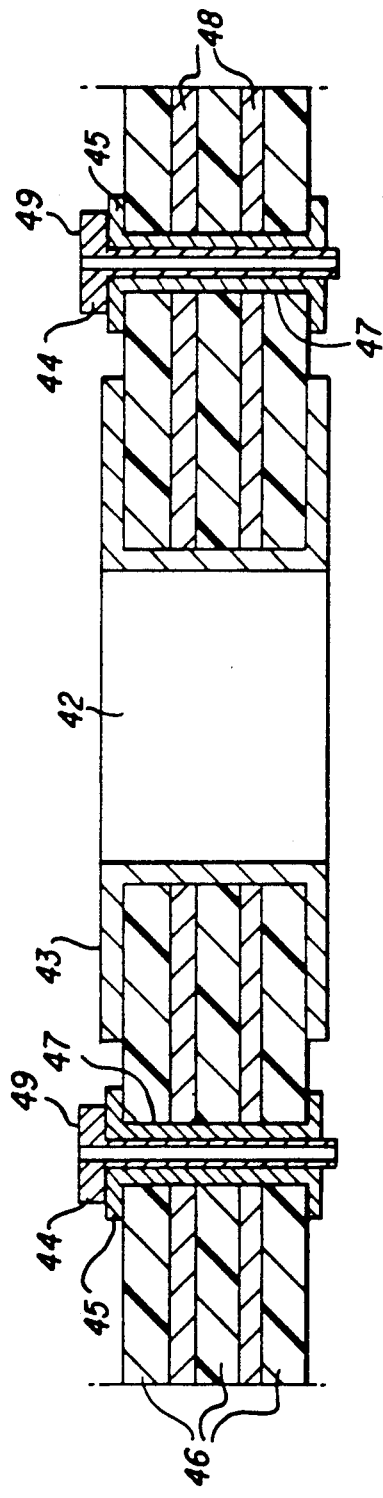
FIG. 2 is a sectioned view taken along the section lines labelled 2—2 of FIG. 1.

Referring now to FIG. 2 which is a cross-section of the multilayered circuit board 40, which illustrates the opening 42 and the plated through opening therein wherein copper is plated into the hole 42 and to the surface lands on both surfaces of the board surrounding the hole to form the plating shown as 43. The thermally and electrically conductive reference planes 48 are shown extending up to and making contact with the metal forming the plating 43. The plated through holes 44 extend through the circuit board layers and in the areas corresponding to the conductive reference planes 48 there are provided openings 47 which are of such a diameter that it is assured that electrical contact will not be made between the reference planes 48 and the conductive plated through holes 44. The reference planes 48 are in contact with the plated through hole metal 43 along the entire outer periphery of the plated through hole 42.

The female socket pins 49, typically AMP Inc., Harrisburg, PA., Part Number 2-331272-2, are soldered into the conductive plated through holes 44. This facilitates insertion and removal of the linear sensor array 10.

Figure 4:
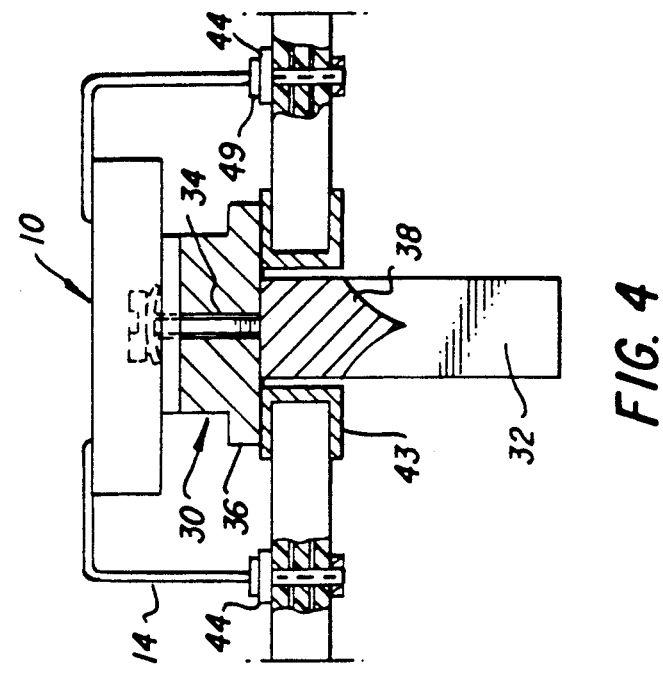
FIG. 4 is a sectioned view taken along the section lines 4—4 of FIG. 3.
Figure 3:
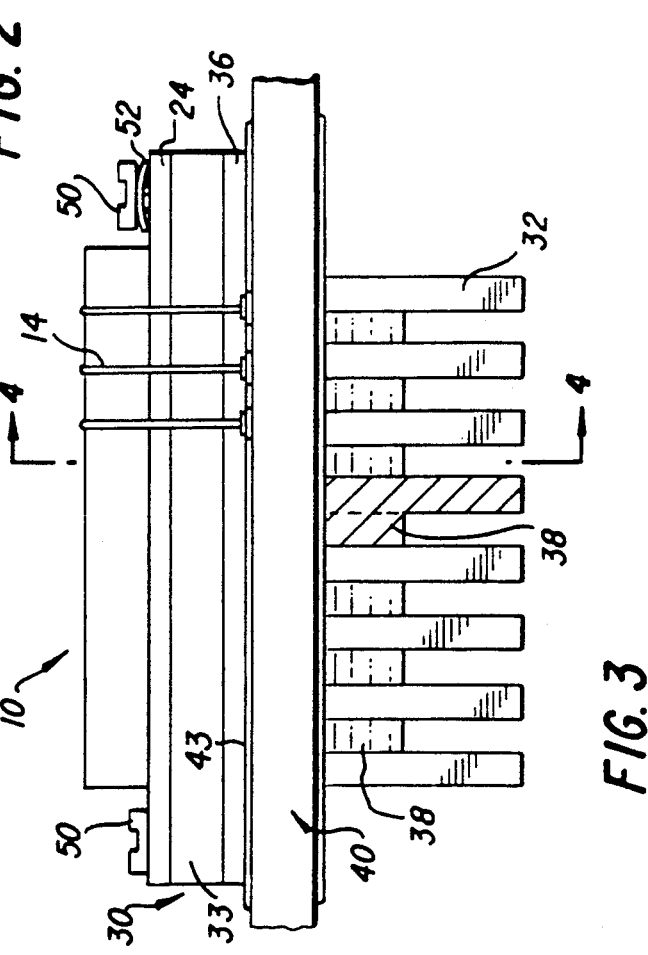
FIG. 3 is a partially sectioned side view of the assembled embodiment of FIG. 1.

Referring now to FIGS. 3 and 4, the linear sensor array 10 is shown in its final mounted position in contact with the heat sink 30 and the printed circuit board 40. The screws 50 are in place with the Belleville washer 52 being inserted at one end to allow for physical movement. The curved V-shape of the air deflectors 38 are shown clearly in FIG. 4. In the preferred assembly, the conductive socket pins 49 are soldered to the plated through holes 44 at the same time as the heat sink flanges 36 are soldered to the plating land 43 of the plated through hole 42. If electrical isolation of the heat sink 30 and the back side plating land of the plated through hole is desired, the vertical walls of the plated through hole 42 may be removed.

Figure 5:
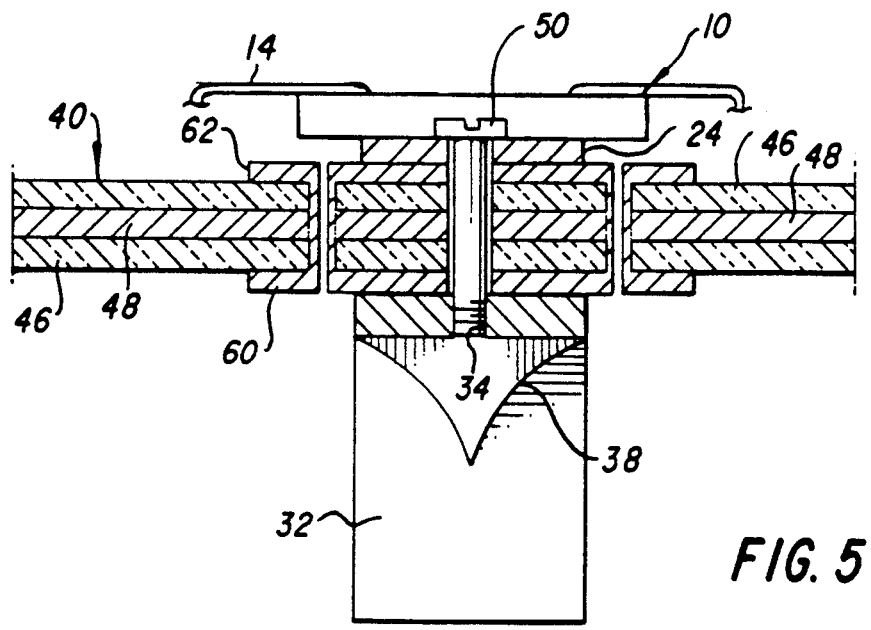
FIG. 5 is a sectioned view corresponding to the section view of FIG. 4 illustrating a second embodiment of the present invention.

Referring to FIG. 5, a second embodiment of the present invention may be formed by maintaining the printed circuit board without a hole 42 and, instead, depositing a copper land 62 and 60 onto the surface area where the linear sensor array 10 is desired to be mounted. In this embodiment the thermal and electrically conductive grease is positioned on the surface of the land 62 and and the conductive back plate 24 of the linear sensor array 10 is mounted to that surface with the array 10 being held in place with a fastener 50 that engages the tapped opening 34 in the heat sink which is mounted to the back surface of the printed circuit board abutting flush against the land 60. Additionally, thermal and electrical contacts can be made from the land 62 to the land 60 by means of multiple plated through holes positioned around and under the periphery of the outline of the linear sensor array and passing through the printed circuit board 40.

Figure 6:
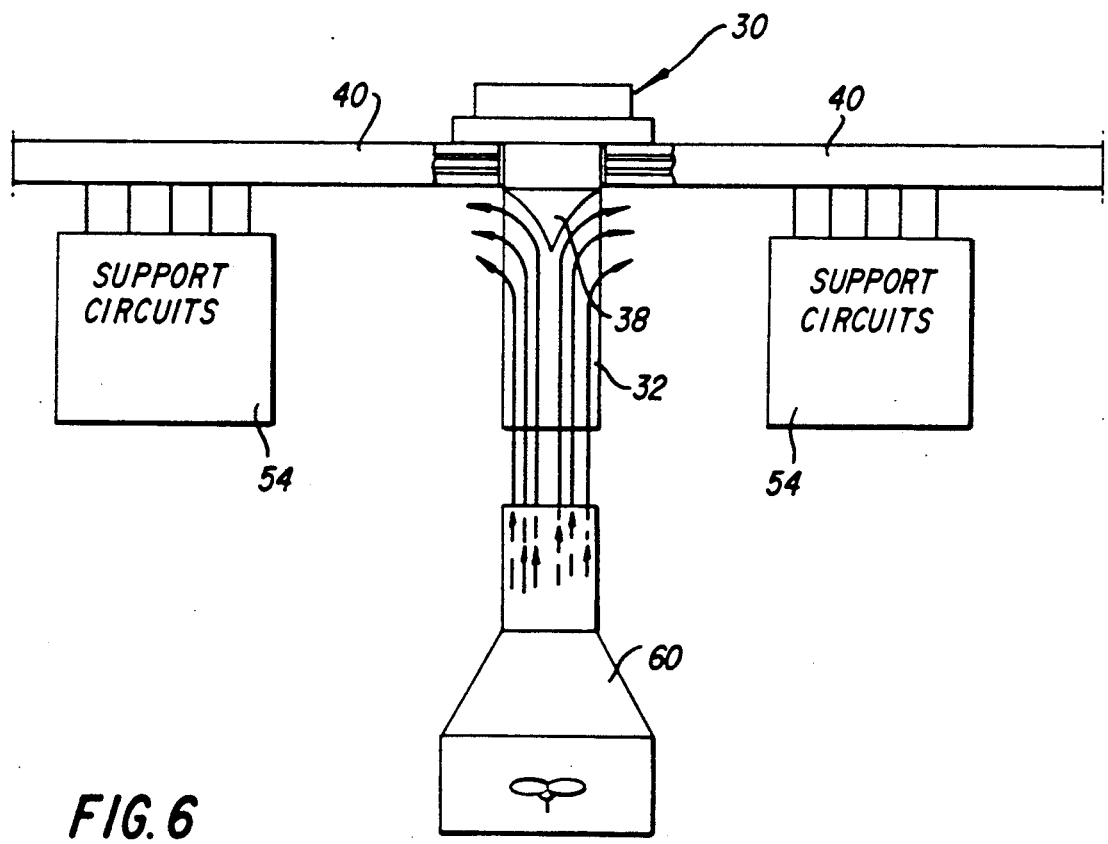
FIG. 6 illustrates the embodiment of the present invention cooled with a cooling fan.

In FIG. 6 the circuit board 40 with the heat sink 30 in place and additionally with driver support circuits 54 positioned on one surface of the sensor board adjacent the heat fins 32 is shown with a fan 60 having an air flow that is directed towards the arched surfaces of the deflector member 38. The air deflectors 38, deflect the air to the support circuits 54 for cooling of the electronics mounted thereon. The deflectors 38, as previously mentioned, insure that the air flow direction change is smooth, thus minimizing turbulence and boundary layer buildup. In the preferred embodiments, back-to-back shaped semi-circular surfaces from the deflectors because they are inexpensive to machine. Other shapes may be more aerodynamically efficient.

Figure 7:
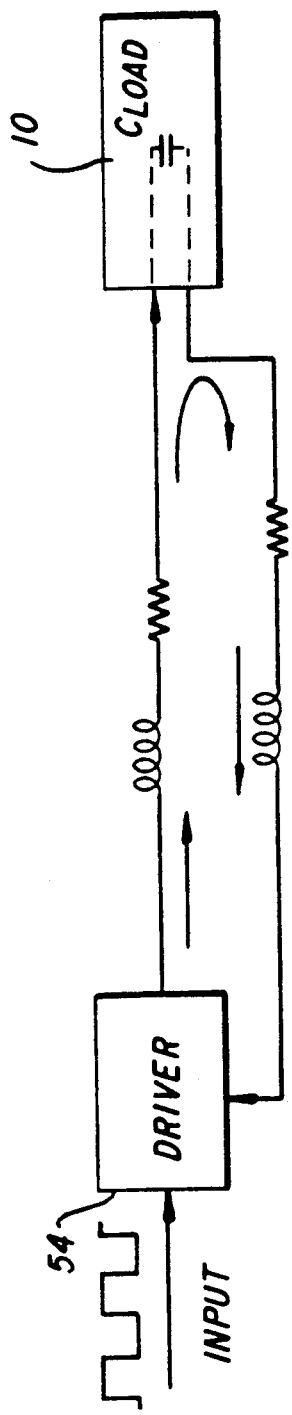
FIG. 7 is a block schematic diagram illustrating distributed electrical parameters associated with the preferred embodiment.

Referring to FIG. 7, clock drivers 54 are designed to supply the high edge currents which are required by the sensor 10. The current flows out of the driver through the capacitive load of the sensor to the sensor reference plane and returns to the driver thereby closing the loop. Resistance and inductance in this current path results in a voltage drop being generated that will cause the reference plane of the sensor to vary on edge clock transitions.

Figure 8:
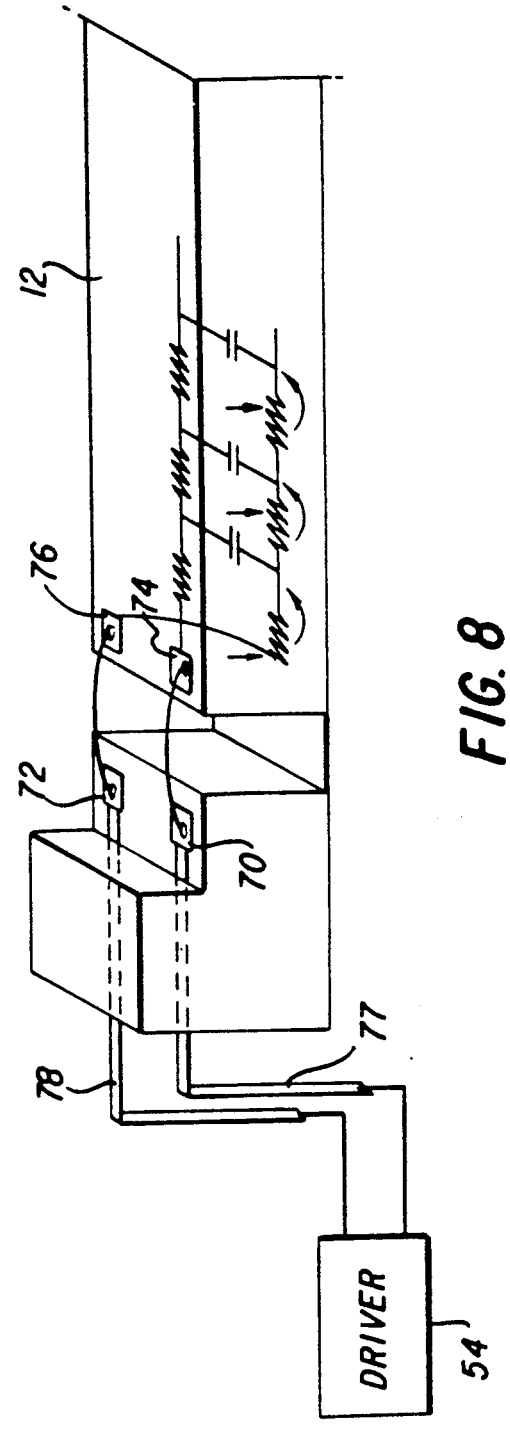
FIG. 8 is a pictorial diagram illustrating current flow through a CCD device not utilizing the present invention.
Figure 9:
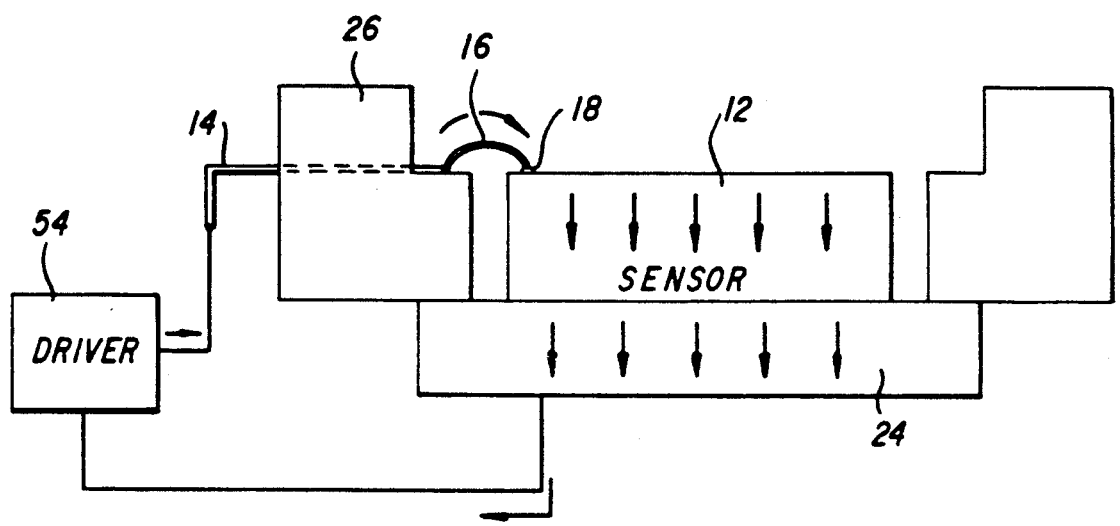
FIG. 9 illustrates clock driver current flow through a sensor device using the present invention.

FIG. 8 illustrates the electrical characteristics in the physical environment, the driver 54 typically is connected to the CCD chip 12 by means of pins 77 and 78 which in turn are connected to pads 70 and 72 respectively, which in turn are connected to the conductors on the CCD chip 12 by means of pads 74 and 76 connected with wire bond strips 79. In this particular arrangement, current flows from the driver 54 to pad 70 through the wire bond 79 to the pad 74 and from there to the respective CCD loads represented as distributed capacitance and resistance. The return path is through the substrate or contact on the well of the CCD chip which in turn is electrically bonded to the pad 76 and from there through a wire bond 79 to the pad 72 and in completing the return path via the pin 78 to the driver 54. With the sensor using the substrate of the device as its reference plane, we find that CCD devices suffer from the fact that their reference plane is the P-Well or substrate and all of the clock return current must be returned through the top side wire bond contact at the pad 76. Additionally, in CCD devices clock currents must flow down the length of the sensor and return to the top side point contact to the driver. A back side reference plane enables the current to flow vertically through a lower resistance path. This is illustrated in FIG. 9 wherein the electrically and thermally conductive bar member 24 is attached to the back surface of the CCD device 12 and to the frame 26 supporting the image sensor. The driver circuit 54 thus provides current to the sensor through the pins 14, the wire bond 16 to the pads 18 which current is then utilized by the sensor and returned by a multiplicity of parallel paths through the conductive bar member 24 which is in turn electrically connected to the current return of the driver 54.

Figure 10:
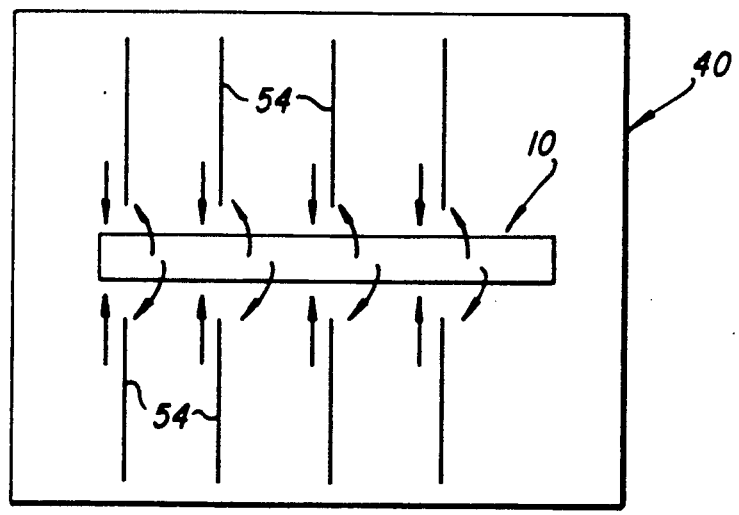
FIG. 10 illustrates the current flow from a plurality of clock drivers and a sensor utilizing the present invention.

FIG. 10 illustrates the current paths from the sensor 10 to a multiplicity of clock driver circuits 54 positioned in parallel on opposite sides of the sensor 10. This particular configuration will minimize the voltage bounce on the linear sensor array as well as the sensor support circuitry (drivers 54).

While there has been shown what are considered to be the preferred embodiments of the present invention, it will be manifest that many changes and modifications may be made therein, without departing from the essential spirit of the invention. It is intended therefore, to cover all such modifications as may fall within the true scope of the claims.

We claim:

1. An image sensor mounting system comprising:
   an image sensing device having a plurality of electrical pads;
   a thermal and electrically conductive bar;
   an insulating body member having an opening therethrough receiving said image sensing device, said insulating body member mounted on said conductive bar and said image sensing device mounted in said opening in physical contact with said conductive bar;
   a plurality of conductive pins affixed to said insulating body member;
   a plurality of wire bonds connecting said plurality of conductive pins to electrical pads on said image sensing device;
   a transparent window mounted to said insulating body member;
   a heat sink having at least one surface making thermal contact with said conductive bar;
   a multilayer circuit board having layers of conductive material separated by layers of insulating material and having an opening therethrough receiving said heat sink, and a metal plating extending from one surface of said board through the opening in said board to the opposite surface of said board with selected ones of said layers of conductive material making electrical contact with said metal plating;
   a plurality of socket pins affixed to said multilayer circuit board removably receiving said plurality of conductive pins;
   means for mounting said heat sink in said multilayer circuit board opening in thermal and electrical contact with said metal plating;
   a layer of thermal and electrically conductive grease positioned on the at least one surface of said heat sink; and
   means for mounting said conductive bar on said heat sink sandwiching said layer of grease.

2. An image sensor mounting system comprising:
   an image sensor having a transparent window on a front surface and a thermal and electrically conductive back surface;
   a heat sink having at least one surface making thermal contact with the back surface of said image sensor;
   a multilayer circuit board having layers of conductive material separated by layers of insulating material and having an opening therethrough which receives said heat sink, and a metal plating extending from one surface of said board through the opening in said board to the opposite surface of said board with selected ones of said layers of conductive material making electrical contact with said metal plating;
   means for mounting said heat sink in said multilayer circuit board opening in thermal and electrical contact with said metal plating;
   a layer of thermal and electrically conductive grease positioned on the at least one surface of said heat sink; and
   means for mounting said image sensor on said heat sink sandwiching said layer of grease including a bolt having a head and a body, with said body extending through a portion of said image sensor and engaging said heat sink and a resilient member positioned between the head of said bolt and the portion of said image sensor to permit limited motion of said image sensor with respect to said heat sink.

3. An image sensor mounting system comprising:
   an image sensor having a transparent window on a front surface and a thermal and electrically conductive back surface;
   a heat sink having at least one surface making thermal contact with the back surface of said image sensor formed as a substantially rectangular body member having a first surface for receiving said image sensor and a second opposite surface having a plurality of spaced apart fins extending therefrom and a plurality of air deflectors positioned one each between each of said fins;

a multilayer circuit board having layers of conductive material separated by layers of insulating material and having an opening therethrough which receives said heat sink, and a metal plating extending from one surface of said board through the opening in said board to the opposite surface of said board with selected ones of said layers of conductive material making electrical contact with said metal plating;

means for mounting said heat sink in said multilayer circuit board opening in thermal and electrical contact with said metal plating;

a layer of thermal and electrically conductive grease positioned on the at least one surface of said heat sink; and means for mounting said image sensor on said heat sink sandwiching said layer of grease.

4. An image sensor mounting system comprising:

an image sensor having a transparent window on a front surface and a thermal and electrically conductive back surface;

a heat sink having at least one flat surface;

a multilayer circuit board having layers of conductive material separated by layers of insulating material and having a conductive land surface on each outer layer of said circuit board and at least one plated through hole extending through said circuit board electrically and thermally connecting said land surfaces with selected ones of said layers of conductive material making electrical contact with the plating of said plated through hole;

a layer of thermal and electrically conductive grease positioned on the at least one surface of said heat sink and the back surface of said image sensor; and means for mounting said image sensor on one land surface of said circuit board and said heat sink on the opposite land surface so as to sandwich said layer of grease therebetween, said means including a bolt having a head and a body, with said body extending through a portion of said image sensor and engaging said heat sink and a resilient member positioned between the head of said bolt and the portion of said image sensor to permit limited motion of said image sensor with respect to heat sink.

5. An image sensor mounting system comprising:

an image sensor having a transparent window on a front surface and a thermal and electrically conductive back surface;

a heat sink having, a substantially rectangular body member, a first surface for abutting a land surface and an opposite surface having a plurality of spaced apart fins extending therefrom and a plurality of air deflectors positioned one each between each of said fins.

a multilayer circuit board having layers of conductive material separated by layers of insulating material and having a conductive land surface on each outer layer of said circuit board and at least one plated through hole extending through said circuit board electrically and thermally connecting said land surfaces with selected ones of said layers of conductive material making electrical contact with the plating of said plated through hole;

a layer of thermal and electrically conductive grease positioned on said first surface of said heat sink and the back surface of said image sensor; and means for mounting said image sensor on one land surface of said circuit board and said heat sink on the opposite land surface so as to sandwich said layers of grease therebetween.

6. An image sensor mounting system according to claim 3 wherein said image sensor is provided with an electrical reference plane as its back surface.

7. An image sensor mounting system according to claim 6 and further comprising:

at least one driver circuit having an electrical return path connected to the electrical reference plane of said image sensor.

8. An image sensor mounting system according to claim 7 wherein there is provided a plurality of driver circuits each mounted upon a board with each of said boards being mounted along the length of said image sensor in proximity to and in electrical contact with conductors on said image sensor.

9. An image sensor mounting system according to claim 8 and further comprising:

a source of cooling air directing a flow of cooling air to the fins and air deflectors of said heat sink, such that said deflectors direct the cooling air to said plurality of driver circuits.

10. An image sensor mounting system according to claim 5 wherein said image sensor is provided with an electrical reference plane as its back surface.

11. An image sensor mounting system according to claim 10 and further comprising:

at least one driver circuit having an electrical return path connected to the electrical reference plane of said image sensor.

12. An image sensor mounting system according to claim 11 wherein there is provided a plurality of driver circuits each mounted upon a board with each of said boards being mounted along the length of said image sensor in proximity to and in electrical contact with conductors on said image sensor.

13. An image sensor mounting system according to claim 12 and further comprising:

a source of cooling air directing a flow of cooling air to the fins and air deflectors of said heat sink, such that said deflectors direct the cooling air to said plurality of driver circuits.

* * * * *